United States Patent
Phan Le

(10) Patent No.: US 8,624,137 B2
(45) Date of Patent: Jan. 7, 2014

(54) DEVICE WITH A MICRO ELECTROMECHANICAL STRUCTURE

(75) Inventor: Kim Phan Le, Eindhoven (NL)

(73) Assignee: NXP, B.V., Eindhoven (NL)

( * ) Notice: Subject to any disclaimer, the term of this patent is extended or adjusted under 35 U.S.C. 154(b) by 242 days.

(21) Appl. No.: 13/120,351

(22) PCT Filed: Sep. 17, 2009

(86) PCT No.: PCT/IB2009/054071
§ 371 (c)(1),
(2), (4) Date: Mar. 22, 2011

(87) PCT Pub. No.: WO2010/035184
PCT Pub. Date: Apr. 1, 2010

(65) Prior Publication Data
US 2011/0168531 A1   Jul. 14, 2011

(30) Foreign Application Priority Data

Sep. 23, 2008   (EP) .................................. 08164937
Sep. 17, 2009   (WO) ................... PCT/IB2009/054071

(51) Int. Cl.
*H01H 1/14*   (2006.01)

(52) U.S. Cl.
USPC ........................................................ 200/239

(58) Field of Classification Search
USPC .................... 200/239, 238, 181, 600; 335/78
See application file for complete search history.

(56) References Cited

U.S. PATENT DOCUMENTS

| | | | |
|---|---|---|---|
| 6,888,662 B2 | 5/2005 | Abu-Ageel | |
| 7,683,746 B2 * | 3/2010 | Nakanishi | 335/78 |
| 7,724,111 B2 * | 5/2010 | Paineau et al. | 335/78 |
| 8,018,308 B2 * | 9/2011 | Kwon et al. | 335/78 |
| 2006/0091385 A1 | 5/2006 | Mair et al. | |
| 2007/0296527 A1 | 12/2007 | Lutz et al. | |
| 2008/0078662 A1 * | 4/2008 | Naito et al. | 200/181 |
| 2010/0154553 A1 | 6/2010 | Phan Le et al. | |
| 2010/0277262 A1 | 11/2010 | Phan Le et al. | |

FOREIGN PATENT DOCUMENTS

| | | |
|---|---|---|
| WO | 2005/015735 A2 | 2/2005 |
| WO | 2006/067757 A1 | 6/2006 |

OTHER PUBLICATIONS

Gagnepain, J., "Nonlinear Properties of Quartz Crystal and Quartz Resonators: A Review", Proc. 35th Ann. Freq. Control Symposium, pp. 14-30 (1981).

(Continued)

*Primary Examiner* — Edwin A. Leon
*Assistant Examiner* — Anthony R. Jimenez

(57) ABSTRACT

A device has a micro electromechanical structure (10) with a first arm (102), at least one second arm (104a, b) connected to each other via a connection (100). Both arms (102, 104a, b) and the connection (100) are preferably made of a single crystalline body. The first and second arm (102, 104a, b) have end portions attached to a substrate, but otherwise the arms and their connection are free to move relative to the substrate. The first and second arm (102, 104a, b) extending from the end portions to the connection (100) along different directions, preferably perpendicularly to each other. An electrode (12) is provided on the substrate, adjacent to the micro electromechanical structure (10) to excite vibration of the structure. The two arms in different directions make it possible to reduce the nonlinearity of the stiffness during vibrations of the structure.

21 Claims, 5 Drawing Sheets

(56) References Cited

OTHER PUBLICATIONS

Gabbay, Lynn D., et al. "Computer-Aided Generation of Nonlinear Reduced-Order Dynamic Macromodels—I: Non-Stress-Stiffened Case", J. Microelectromechanical Systems, vol. 9, No. 2, pp. 262-69 (Jun. 2000).

Kaajakari, V., et al. "Nonlinear Limits for Single-Crystal Silicon Microresonators", J. of Microelectromechanical Systems, vol. 13, No. 5, pp. 715-724 (2004).

Kaajakari, V., et al. "Nonlinear Mechanical Effects in Silicon Longitudinal Mode Beam Resonators", Sensors and Actuators A, vol. 120, pp. 64-70 (2004).

Agarwal, M., et al. "Non-Linearity Cancellation in MEMS Resonators for Improved Power-Handling", IEEE Electron Devices Meeting 2005, IEDM Technical Digest, pp. 286-289 (2005).

Agarwal, M., et al. "Nonlinear Characterization of Electrostatic MEMS Resonators", IEEE Int'l. Frequency Control Symp. and Expo 2006, IEEE, pp. 209-212 (2006).

Agarwal, M. et al. "Optimal Drive Condition for Nonlinearity Reduction in Electrostatic Microresonators," Appl. Phys. Letters 89, 214105, pp. 214105-1 to 214105-3 (2006).

Braghin, F., et al. "Nonlinear Dynamics of Vibrating MEMS", Sensors and Actuators A 134, pp. 98-108 (2007).

Batra, R., et al. "Reduced-Order Models for Microelectromechanical Rectangular and Circular Plates Incorporating the Casimir Force", Int'l. J. of Solids and Structures 45, pp. 3558-3583 (Feb. 2008).

Mestrom, R., et al. "Modelling the Dynamics of a MEMS Resonator : Simulations and Experiments", Sensors and Actuators A 142, pp. 306-315 (2008).

International Search Report and Written Opinion for Int'l. Patent Application No. PCT/IB2009/054071 (Feb. 3, 2010).

\* cited by examiner

DEVICE WITH A MICRO ELECTROMECHANICAL STRUCTURE

FIELD OF THE INVENTION

The invention relates to a device that contains a micro electromechanical structure.

BACKGROUND OF THE INVENTION

Known MEMS devices (Micro ElectroMechanical System devices) are integrated circuit structures wherein part of circuit structure has been undercut so that it is free to move relative to the underlying substrate. In addition the MEMS device contains electronic circuitry to generate electric fields to exert forces on the free part of the structure and/or measure electric parameters relating to the free part, such as current flowing to it, accumulated charge etc. In a typical MEMS device the free part is made of crystalline silicon, but other materials may be used, dependent on the technology used to manufacture the integrated circuit.

Devices with micromechanical structures are typically manufactured by processing a silicon wafer, using techniques known from integrated circuit processing. In order to create a free part in a micro mechanical structure a two-dimensional shape of a mechanical bar or block on the wafer may be defined by lithography, and undercut etching may be used to detach part of the bar or block from the underlying material. Thus it is possible to create a bar or block of crystalline silicon material that is free to vibrate mechanically over at least part of its length. Moreover, during manufacture of such a device electrodes may be defined that can be used to apply electrical fields in order to excite the vibrations.

PCT patent application WO2006/067757 describes a charge biased micro-mechanical resonator, containing a micromechanical structure. This document shows a clamped bar structure, which comprises an elongated strip of material, with end portions attached to the underlying substrate and an unattached mid portion that is free to move subject to the laws of elasticity that govern deformation of the bar. An electrode next to this mid portion can be used to excite vibrations.

Non-linearity is a known problem of this type of device. For small deformation the behavior of the structure is linear, i.e. the amount of deformation is proportional to force applied to the structure. For larger deformations non-linearity gives rise to deviations from the linear behavior. Non-linearity may have detrimental effects in terms of decreased power efficiency, lower resonance quality etc. Non-linearity arises, among others, due to non-linear elastic properties of the material of the structure. WO2006/067757 describes that the use of stored charge can reduce non-linearity.

Another solution to the problem of non-linearity is described in an article by Manu Agarwal et al. in Applied Physics Letters 89, 214105 2006, pages 214105-1 to 214105-3 and titled "Optimal drive condition for nonlinearity reduction in electrostatic microresonators". Agarwal discloses that in a clamped bar the non linearity due to the mechanical properties of the bar can be compensated at certain excitation amplitudes by opposite non-linear behavior of the electrical field strength of the field from the electrode. With a fixed voltage difference between the electrode and the bar, the force due to this field is inversely proportional to the square of the distance between the bar and the electrode, which means that the force depends non-linearly on the displacement of the bar. Agarwal et al note that this non-linearity can compensate the elastic non-linearity. However, this solution only works over a narrow range of excitation amplitudes, as the non-linearity of the electric field and the non-linearity due to the material properties and geometry depend differently on amplitude. Moreover, the double clamping of the bar leads to energy losses which reduce the quality factor of the resonance.

SUMMARY OF THE INVENTION

Among others, it is an object to provide for reduced non-linearity of a micro electromechanical structure.

A device according to claim 1 is provided. This device comprises a micro electromechanical structure and an electrode on a substrate. The micro electromechanical structure comprises a "free" part that is able to move relative to the substrate. The free part comprises parts of a first arm, a second arm and a connection between the first and second arm. The arms extend transversely to each other. In this way, an additional degree of design freedom is created that makes it possible to reduce non-linearity over a wider range. In an embodiment at least two non-zero order coefficients of an expansion of the stiffness in powers of the deviation of the structure from a stable position are made substantially zero by adjusting the dimensions of the arms.

The second arm may be combined with a third arm to form a clamped bar arrangement, with an optional area to form a mass in the middle of the bar and with the first arm extending transversely to the bar, for example. This provides for a symmetrical arrangement where the directions of movement are limited due to symmetry. In a further embodiment the first arm is used as a main arm, to provide the majority of the mechanical spring force and to make one non zero order coefficient zero when there is an operational bias voltage on the electrode, and the second and third arm are used as auxiliary arms to compensate for higher order non-linearity. Preferably, the electrode is configured so that it applies an average field in the direction of the first arm. Thus losses due the second and third arms can be kept low.

In an embodiment a "dog bone" structure is used, with masses formed by two mains area, which are connected via the first arm. Second arms may be attached to each of the main areas. In this case the first arm may be kept free from the substrate, or it may be attached to the substrate at a point where there is zero displacement due to symmetry. Thus losses due to attachment to the substrate can be further reduced, which results in a high Q factor in resonant operation.

In another embodiment a main area between two first arms is used, which are attached to the substrate via with further arms transverse to the first arms on their end opposite to the substrate. This makes it possible to realize a high quality factor, because the first arms need not be clamped and at the same time non-linear effects can be reduced.

BRIEF DESCRIPTION OF THE DRAWINGS

The above and other objects and advantageous aspects will become apparent from a description of exemplary embodiments, using the following Figures.

FIG. 1 schematically shows a micro electromechanical structure 10 and an electrode 12 in top view. Micro electromechanical structure 10 comprises a main area 100, a first arm 102, and second and third arms 104a,b. In an embodiment main area 100, and first, second and third arms 102, 104a,b, are made of a continuous body of mono-crystalline silicon. In the illustrated embodiment main area 100 has a mass (proportional to its area) that exceeds the mass of first, second and third arms 102, 104a,b. Main area 100, first, second and third arms 102, 104a,b are provided on top of a substrate (not shown, notionally below the plane of the drawing). Micro electromechanical structure 10 is largely free from the substrate so that it is capable of movement relative to the substrate. End portions of first arm 102, and second and third arms 104a,d are attached to the substrate. Except for the end portions, main area 100, first, second and third arms 102, 104a,b are "free" from the substrate so that they are capable of moving relative to the substrate, subject to forces due to their attachment to the fixed end portions.

Figure 1:
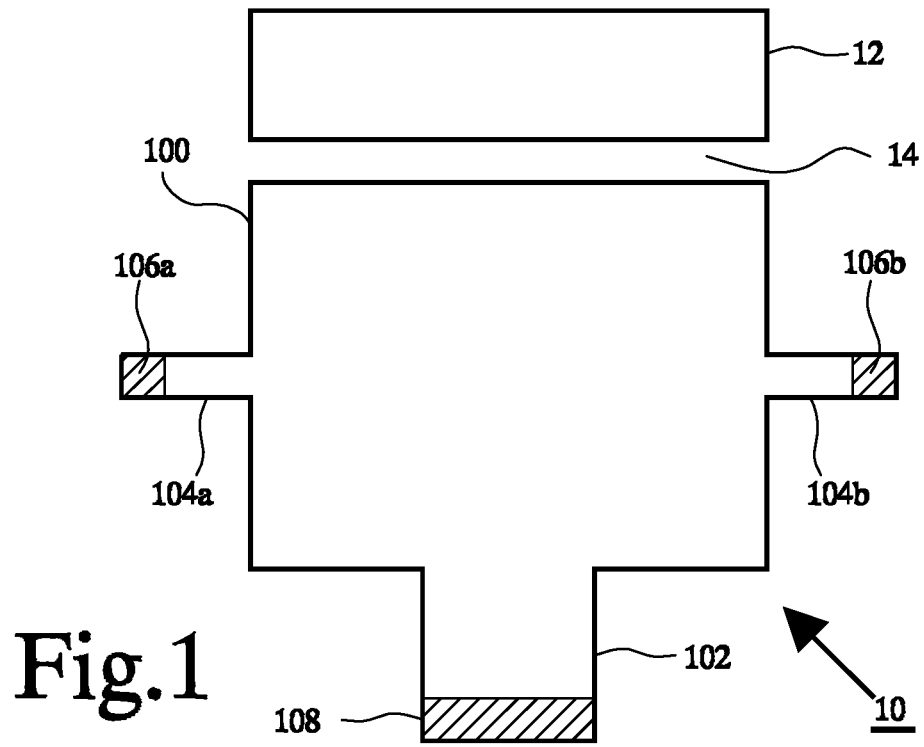
FIG. 1 shows a micro electromechanical structure

Electrode 12 is located adjacent to main area 100, divided from it by a gap 14, at a side opposite to the side from which first arm 102 extends. Electrode 12 may be attached entirely to the substrate.

First arm 102 extends from main area 100 in a first direction. An end portion 108 of first arm 102 is attached to the substrate, the remainder of first arm having no direct attachment to the substrate.

Second and third arms 104a,b extend from main area 100 at mutually opposite sides. Second and third arms 104a,b have the same dimensions. End portions 106a,b (indicated by shading) of second and third arm 104a,b are attached to the substrate (not shown) Second and third arm 104a,b extend from main area 100 in a direction transverse to the direction of extension first arm 102. As shown second and third arm 104a,b extend perpendicularly to the direction of first arm 102. But more generally a transverse extension with an angle, say, between forty five degrees and hundred thirty five degrees may be used (as used herein "transverse to a direction" covers perpendicular to that direction as well as other directions that are not parallel to that direction).

Figure 2:
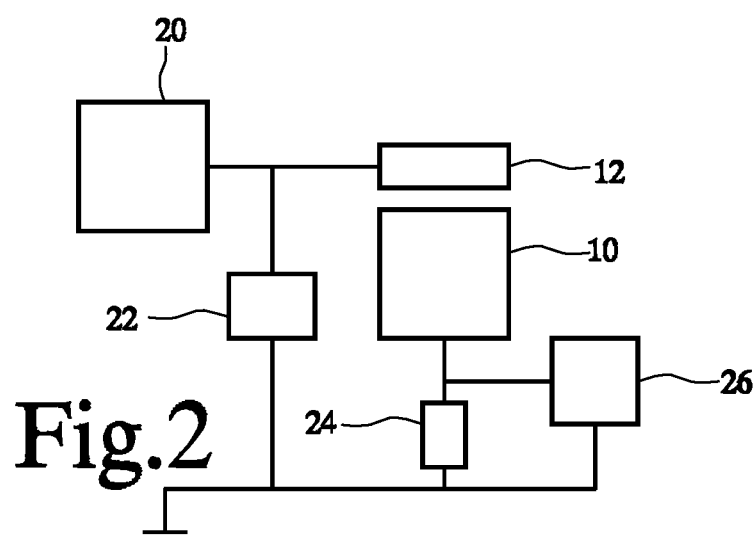
FIG. 2 shows a device with a micro electromechanical structure

FIG. 2 shows a device with micro electromechanical structure 10 (shown as a "black box"). A driver circuit 20 and a bias voltage source 22 are provided, with outputs coupled to electrode 12 and micro electromechanical structure 10 is coupled to ground via a resistance 24 and to a sensing circuit 26. Driver circuit 20 and bias voltage source 22 may be used to apply AC and DC components of an electric field through the gap.

In a further embodiment a pair of further electrodes may be provided on either side of first arm 102, separated from main area by a further gap. In this case, driver circuit 20 may apply a voltage difference between this pair on one side and electrode 12 on the other side. Although a circuit is shown in which main area 100 and the arms are coupled to a resistor, these may be connected differently in other embodiments, for example to ground. The sensing circuit may be coupled to first arm 102 for example, or to electrode 12 for measuring current to electrode 12. Another alternative is to connect the actuation circuit to the structure while the sensing circuit is attached to the electrode. In terms of FIG. 2 this means that blocks 20,22 may be electrically connected to structure 10, while blocks 24,26 are electrically connected to electrode 12.

In operation, main area 100 acts as a mass and first, second and third arms 102, 104a,b, act as springs on which this mass is suspended. In a stationary electric field first, second and third arms 102, 104a,b, define a stable position of main area 100. When main area 100 is away from the stable position first, second and third arms 102, 104a,b exert mechanical (elastic) forces (also called spring forces) to move main area 100 back to its stable position. For small deviations from the stable position the combination of these mechanical forces may be a linear function of de deviation from the stable position. For larger deviations, a non-linear relation holds between the mechanical force and the deviations. This relation may be expressed as a sum of terms, each term being the product of a coefficient and a respective power (1,2, etc) of the deviation. As there is no term with zero power, the force may be expressed as a factor times the deviation, wherein the factor is called the "stiffness". The stiffness is the force divided by the deviation. The stiffness can be expressed as a sum of further terms, each term being the product of one of the coefficients and a respective lowered power (0,1, etc) of the deviation.

First arm 102 provides for a force with both even and odd powers in the force as a function of displacement in the direction perpendicular to the direction of extension of second and third arms 104a,b, or in other words, it provides for a stiffness with both odd and even powers.

An electric voltage between electrode 12 and micro electromechanical structure 10 causes an electric field between electrode 12 and main area 100, which also results in a force on main area 100. This force is directed in the direction perpendicular to the direction of extension of second and third arms 104a,b. This force also depends non-linearly on the deviation, because the electric field strength and charge depends on gap size. This force may also be expressed as a sum of terms, each term being a product of a coefficient and a power of the displacement, with both even and odd powers. As in the case of the elastic force, the electric force may be expressed as a stiffness times the deviation.

In an embodiment first arm 102 provides the majority of the mechanical force to return the structure to its stable position. Second a third arms 104a,b serve to compensate for non-linearity of the stiffness due to first arm 102 and the electric force provided by the field from electrode 12. Due to symmetry second and third arms 104a,b, only provide for a force with terms with odd powers (1, 3 etc) when main area 100 is displaced in a direction perpendicular to the direction of extension of second and third arms 104a,b from main area 100. In other words, in this case the second and third arms 104a,b affect stiffness for such displacement only for even powers (0, 2 etc.).

The overall force on main area 100 is a sum of the elastic force from first, second and third arms 102, 104a,b and the electric force. Thus the overall force can also be expressed as a sum of terms, wherein each terms is the product of a power of the deviation and a sum of coefficients for that power in the expressions for the individual elastic force and the electric force.

As is relevant here, the electric force and the elastic forces provide for second and higher order coefficients of opposite sign. That is, whereas the elastic stiffness "hardens" (gets stronger) with increasing deviation, the electric stiffness "softens" (gets weaker). This means that the combined coefficients of the stiffness for several non-zero powers of the deviation can be made zero, non linearity due to electric and elastic forces cancelling each other. Thus linear behavior over a large range of deviations can be realized.

This should be contrasted with a situation without first arm 102. With only second and third arms 104a,b cancellation of the non-linear effects of elastic and electric stiffness can only be realized for a selected size of the deviation. Cancelling of coefficients can be achieved only for coefficients for even, non zero powers of the deviation in the elastic stiffness, because second and third arms 104a,b only provides non-zero coefficients for these powers. As the electric stiffness also has a non zero coefficients for odd, non zero powers of the deviation, the main contribution to non-linearity, the coefficient of the first power of the deviation cannot be made zero without first arm 102. Instead this coefficient must be compensated by the effect of higher power terms, which is only possible for a singular deviation size.

It has been found that by using a combination of second and third arm 104a,b and a first arm 102 in a direction transverse to the direction of second and third arms 104a,b it is made possible to cancel or at least reduce non-linearity over a much larger range of amplitudes. A bias voltage source 22 may be provided that is configured to supply a bias voltage at which a plurality of non-zero order coefficients of the stiffness is substantially made to cancel. Such a bias voltage source can act as bias means for biasing the electrode 12 to this bias voltage.

The precise dimensions that lead to such an elimination or reduction depend on the particular device structure. For a given structure it can readily be determined experimentally or by using a model. In an experimental determination devices with arms of various dimensions may be made and the stiffness may be measured, so that coefficients of the stiffness can be plotted as a function of the dimensions and dimensions that lead to the elimination or reduction of coefficients can be selected from the plot.

Instead of using experiments, a model may be used to predict the coefficients. In such a model, the structure can be modeled as a mass m (the main area) hung by three springs connected in parallel. For the model it may be supposed that the mass m is not stretched, that means it does not contribute to significant spring stiffness. The stiffness of the whole spring system is the sum of the stiffness of second and third arms 104a,b, which will be called springs X with a length Lx/2 and a width Wx and the stiffness of the first arm 102, which will be called a spring Y with a length Ly and a width Wy. In the following effective spring stiffnesses of the constituent springs will be calculated separately.

Springs X can be in fact modeled as a single clamped-clamped beam with the length Lx and width Wx, which is loaded at the middle point. The spring stiffness expression contains only the zeroth and the even terms:

$$k_x(x) = k_{x0}(1 + k_{x2}x^2); \quad (1)$$

in which:

$$k_{X0} = \frac{10.42hW_X^3 Y_0}{L_X^3}; \quad (2)$$

$$k_{X2} = \frac{2Y_1}{L_X^2} + \frac{0.767}{W_X^2}; \quad (3)$$

where h is the height of the spring (in a first, Z direction perpendicular to the plane of FIG. 1).

The effective spring stiffness of the longitudinal spring Y can be calculated using a similar method as for the free-free beam example, which starts from the wave equation:

$$\rho A \frac{\partial^2 u}{\partial t^2} = \frac{\partial}{\partial y}\left(AE\frac{\partial u}{\partial y}\right); \quad (4)$$

Herein E denotes Young's modulus, $\rho$ is the mass density, A is the cross section of the beam, u is the displacement along the y direction (direction along the length of spring Y) of a point on the beam. The solution of Eq. (4) can be approximated by the form:

$$u(z, t) = x(t)\sin\frac{\pi z}{2L} \quad (5)$$

In which x(t) is the motion (along the beam) of the beam tip and L is the length of the beam. Young's modulus in (4) contains the nonlinear terms. Form equation (4), calculating the partial derivatives and integrating over the length of the beam, we finally have:

$$\rho AL\frac{\partial^2 x}{\partial t^2} = -\frac{\pi^2}{4}\frac{AE_0}{L}x\left(1 + \frac{\pi E_1}{2L}x + \frac{\pi^2 E_2}{4L^2}x^2\right) \quad (6)$$

Herein E0, E1, E2 are zeroth, first and second order coefficients of a power expansion of Young's modulus. Using Rayleigh's method the effective mass and the effective spring stiffness can be found:

$$k = k_0(1 + k_1 x + k_2 x^2)[N/m]; \quad (7)$$

$$k_0 = \frac{\pi^2 AE_0}{8L}[N/m]; \quad (8)$$

$$k_1 = \frac{\pi E_1}{2L}[m^{-1}]; \quad (9)$$

$$k_2 = \frac{\pi^2 E_2}{4L^2}[N^{-1}m^{-2}]; \quad (10)$$

Note that the above formulae are valid for the free-free beam resonator. For the a "dog-bone" structure, which will be disclosed in the following, we may assume that an extra mass m is mounted on the tip of the free beam and this only affects the effective mass of the system, but the effective spring stiffness is still the same. That means Eqs (7-10) can be used in this case, in which L is replaced by Ly; k, $k_0$, $k_1$, $k_2$ are replaced by $k_Y$, $k_{0Y}$, $k_{1Y}$, $k_{2Y}$, respectively.

Because the springs are connected in parallel, the total mechanical spring stiffness, $k_m$, is the sum of the constituent spring stiffnesses:

$$k_m(x) = k_x(x) + k_y(x); \quad (11)$$

By replacing (1-3) and (7-10) into (11) we finally have:

$$k_m(x) = k_{0m}(1 + k_{1m}x + k_{2m}x^2); \quad (12)$$

In which:

$$k_{0m} = k_{0x} + k_{0y} \quad (13)$$

$$k_{1m} = \frac{k_{0Y}k_{1Y}}{k_{0X} + k_{0Y}} \quad (14)$$

$$k_{2m} = \frac{k_{0X}k_{2X} + k_{0Y}k_{2Y}}{k_{0X} + k_{0Y}} \quad (15)$$

On the other hand, the electrical spring can be expressed with stiffness coefficients:

$$k_{0el} = \frac{C_0 V^2}{g^2}; \quad (16)$$

$$k_{1el} = \frac{3}{2g}; \quad (17)$$

$$k_{2el} = \frac{2}{g^2}; \quad (18)$$

Herein V is the DC bias voltage on electrode 12, g is the gap size between the electrode an main area 100 and Co is the capacitance of the gap in the stable state. To fully compensate for the nonlinear terms of the springs, the higher order terms of the mechanical springs should cancel out the corresponding terms of the electrical spring. That means the following set of equations should be satisfied:

$$k_{0el}k_{1el}=k_{0m}k_{1m}$$

$$k_{0el}k_{2el}=k_{0m}k_{2m} \quad (19)$$

When (19) is satisfied the total spring has only the zeroth order term, that means it is a linear spring. By solving the above set of equations, relations between the dimensions of the springs, the gap, Si crystal orientation and the bias voltage can be defined. Because there are many parameters can be tuned to satisfy (19), we have many choices for selecting a suitable set of parameters which meet other requirements such as the robustness of the structure, operation at moderate bias voltages and high Q.

The following exemplary values of the parameters may be used inputs for Eqs. (19):

Width of the flexural spring, Wx=1 μm.
Length of the longitudinal spring, Ly=30 μm.
The springs X, Y are along the crystal directions [100]
Gap g=300 nm
Electrode length=100 μm Solving equations (19) results in a set of values of the width of the Y spring Wy, the 2× length (Lx) of the spring X and the corresponding bias voltage $V_{DC}$. Those values can be found as the coordinates of the 3D curve.

Although the principles of operation have been demonstrated with one example of a micro electromechanical structure, it should be appreciated that many alternatives are possible. The arrangement of FIG. 1 is X-symmetric, with equal second and third arms 104a,b extending from main area 100 in the X-direction, and first arm 102 as well as the electric field directed in the Y axis perpendicularly to the X direction (at least on average).

Instead of such a symmetric arrangement a more asymmetric arrangement may be realized, for example with only one arm extending in the x-direction, the second arm in the x-direction being omitted. As another example, first arm 102 and second arm 104a need not extend perpendicularly to each other. However, at least a non-zero angle between the two should be used in order to be able to eliminate several coefficients of non-linearity at the same time with a structure of reasonable dimensions. Preferably an angle of between forty five and a hundred thirty five degrees is used. Similarly, the electric field may be applied at an angle to the Y axis.

However, an X-symmetric arrangement (mirror symmetry around the direction of first arm 102) is preferred for the free part of the structure, as this results in better control over movement of the structure (e.g. by excluding movement in the X direction), which limits the risk that non-linear effects due to movement in that direction affects non-linearity. Thus, if one first arm is used, the free part of the structure is preferably mirror symmetric around a central line through first arm 102 extending from main area 100. If more than one arm along the direction of first arm 102 is used, the mirror axis is an axis of symmetry of the arrangement of these arms. Furthermore, in view of this mirror symmetry it is preferred to use arms, such as second and third arm 104a,b, that extend in a direction transverse to the direction of first arm, mirror symmetrically on both sides of the axis of mirror symmetry.

Furthermore, it is preferred that there is also a limited amount of Y-symmetry, i.e. mirror symmetry around an axis perpendicular to the axis of X-symmetry. This applies for example to second and third arm 104a,b, which are mirror symmetric about a further symmetry axis that extends from main area 100 through these arms. This Y symmetry has the effect that the mechanical (elastic) properties of these arms affect only even order coefficients of the stiffness. This makes it possible to construct a design where other (not Y-symmetric) arms are used to make one ore more odd order coefficients of the stiffness zero (e.g. the first order coefficient) and to select the dimensions of second and third arms 104a,b to compensate the even order coefficients of the stiffness (e.g. the second order coefficients) due to the other arms and the electrical field. Thus, second and third arms 104a,b act as auxiliary arms to compensate higher order non-linearity. It has been found that with this compensation an overall even order coefficient of the stiffness can be made zero. More generally, any Y symmetric set of auxiliary arms may be used, i.e. a set of arms that is mirror symmetric around an axis perpendicular to the direction through which first arm 102 extends from main area 100.

Furthermore, it is preferred to use a first arm 102 that has a higher width to length ratio (e.g. at least five times wider) than second and third arm 104a,b (the width is the dimension perpendicular to the direction at which the relevant arm extends from main area 100; the dimension along that direction will be called the length of the arm). This keeps stiffness and therefore losses to second and third arm 104a,b low. It has been found that only relatively small auxiliary arms such as second and third arms 104a,b are needed for the compensation of higher order coefficients. Using a small width for the second and third arm 104a,b has the effect that losses due to the attachment of second and third arm 104a,b to the substrate are kept small. The configuration of the electrode and first arm 102 keeps the losses due to first arm 102 small.

Figure 3:
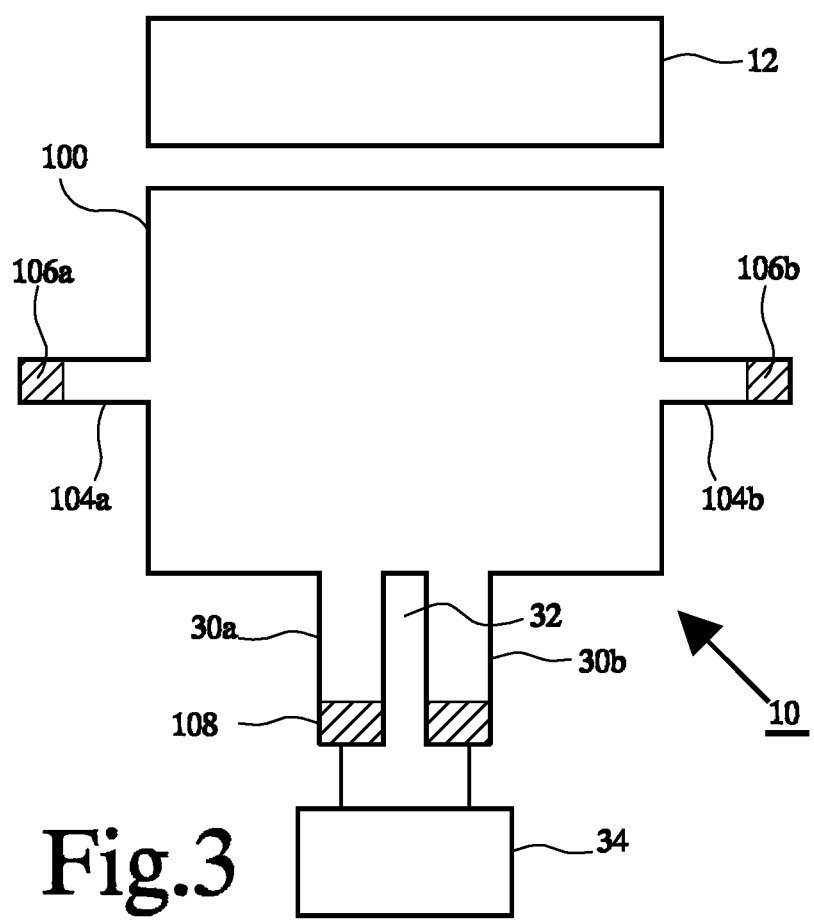
FIG. 3-7 shows micro electromechanical structures

There are many ways to realize symmetric structures. FIGS. 3-7 show a number of examples. FIG. 3 shows an example wherein the first arm is replaced by two parallel sub-arms 30a,b separated by a slit 32. Slit 32 makes it possible to sense deformation of first arm 102 by means of the Piezo-resistive effect. A measurement circuit 34 may be provided to determine the resistance between the ends of first arm 102 on opposite sides of slit 32 at the attachment to the substrate, or to measure a quantity related to this resistance, such as the voltage between the ends when a given current is applied. Instead of using slit 32 and connecting measurement circuit 34 to the both ends of first arm 102, measurement circuit 34 may be coupled to an end of first arm and any other point on the structure, such as the end of one of second or third arm 104a,b.

Figure 4:
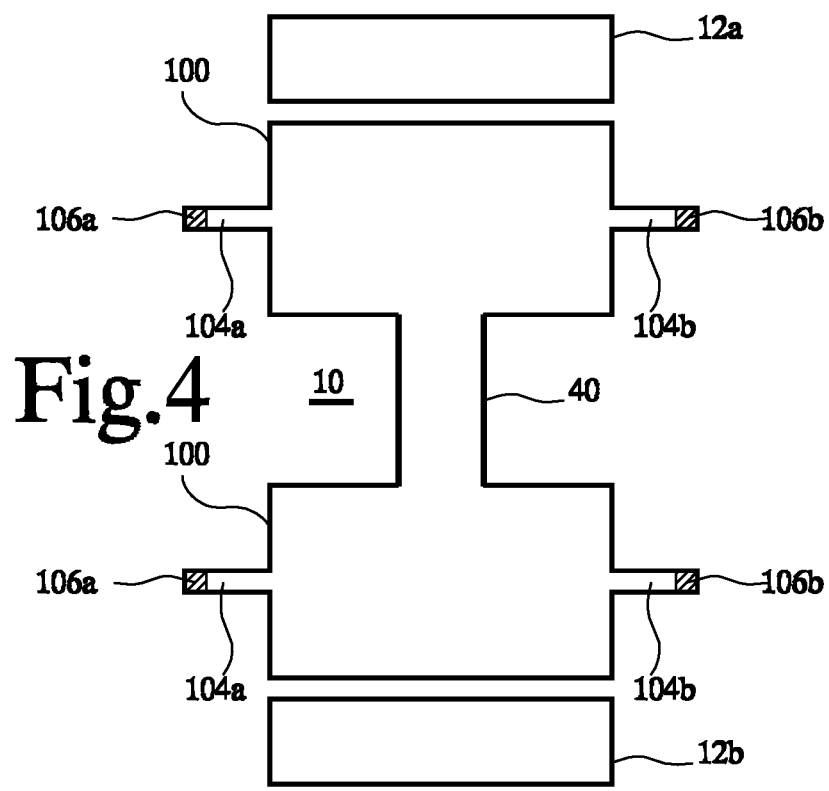

FIG. 4 shows an example wherein the structure is doubled into a kind of "dog-bone" shape, with two main areas 100, each with a mass that exceeds the mass of the arms. A main arm 40 connects the two main areas 100. This structure may provide for resonators of higher quality. Each main area 100 has extending second and third arms 104a,b on mutually opposite sides, in a direction transverse to the direction in which main arm 40 connects main areas 100. Electrodes 12a,b are provided on mutually opposite sides of the dog bone opposite main arm 40.

In this structure main arm 40 takes over the role of first arm 102 symmetrically for both main areas 100. Main arm 40 need not be attached to the substrate (not shown), so that it can move entirely free from the substrate. Alternatively it may be connected midway between main areas 100. This improves overall attachment with little loss of quality.

A driving circuit 42 may be provided to apply periodic voltages in phase to electrodes 12 on mutually opposite sides of the structure. As a result of this form of driving, movement at any attachment to the substrate in the middle of first bar is kept to a minimum, which results in low losses and high quality.

Figure 5:
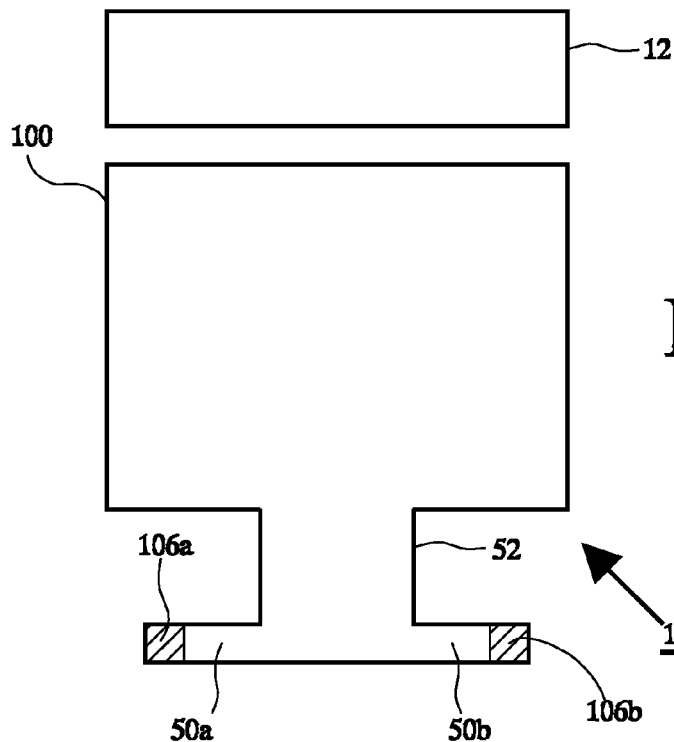

FIG. 5 shows an embodiment wherein second and third arms 50a,b are connected to first arm 52 rather than to main area 100. In this case first arm 52 is not attached to the substrate (not shown), except through second and third arms 50a,b so that first arm 52 can move entirely relative to the substrate. In this case the model is different, because the springs are effectively coupled in series. As a result the expression for the total mechanical spring stiffness, $k_m$ (equation 11) is changed to $k_m^{-1} = k_x^{-1} + k_y^{-1}$ and the expressions that follow from it should be modified correspondingly. However, this does not modify the fact that in an X-symmetric arrangement the second and third arms 50a,b only affect even order coefficients of the stiffness.

Figure 6:
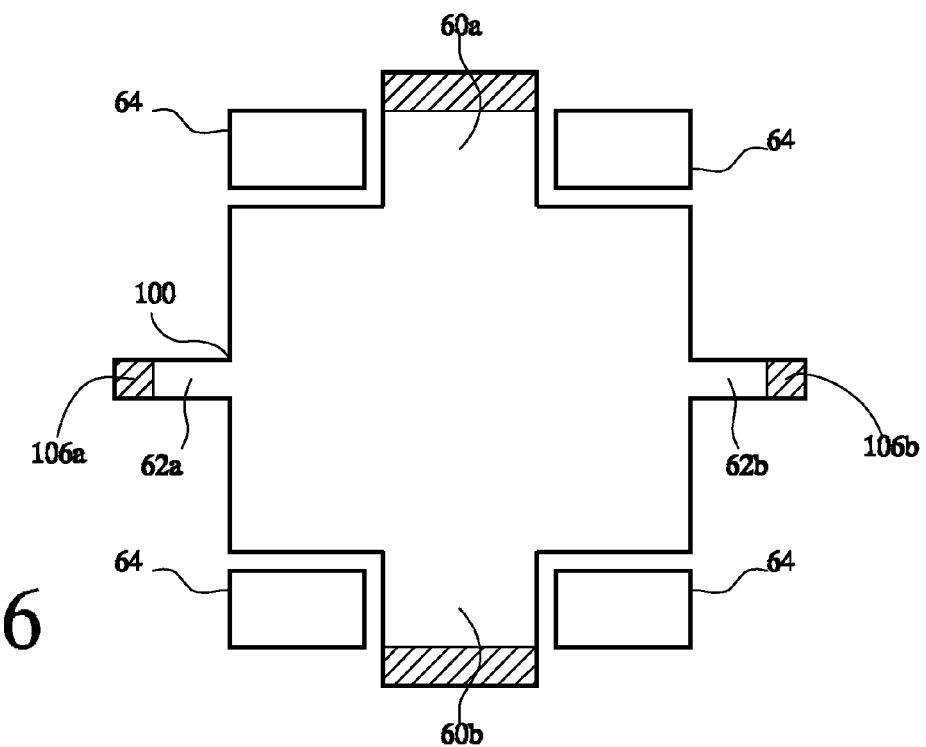

FIG. 6 shows an embodiment, wherein two first arms 60a,b are provided transverse to second and third arms 62a,b on mutually opposite sides of main area 100. Electrodes 64 may be provided on mutually opposite sides of main area 100 and on either side of first arms 60a,b. This structure makes it possible to provide for a doubled force with the same field.

Figure 7:
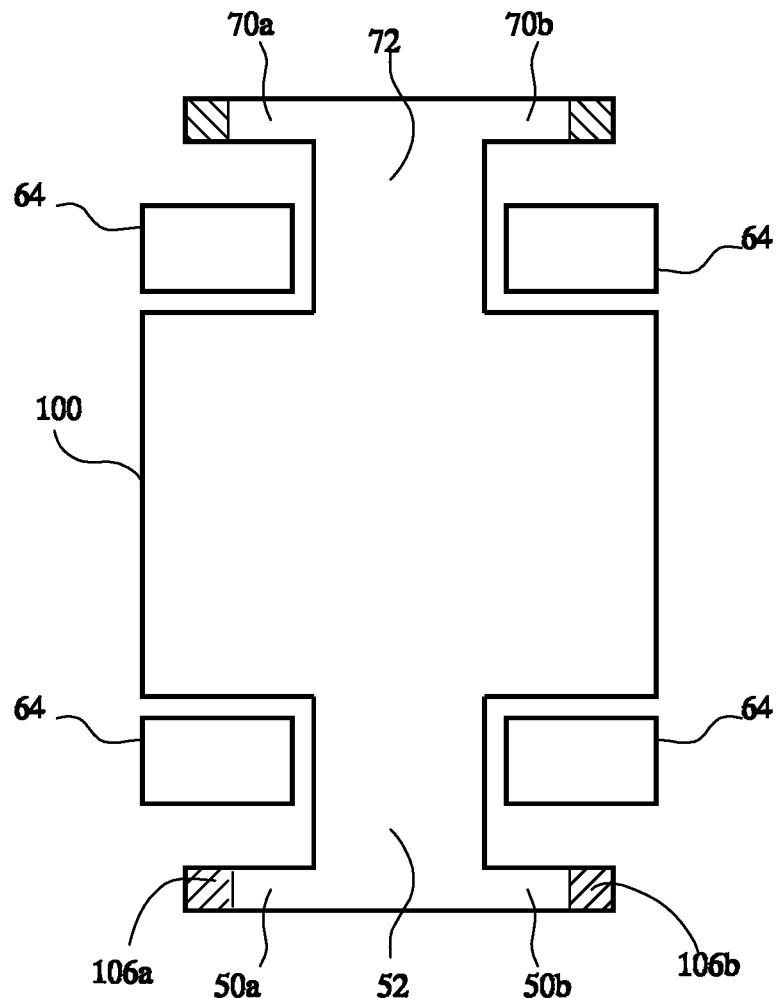

FIG. 7 shows an embodiment like that of FIG. 5, but with first arms 52, 72 and second and third arms 50a,b, 70a,b symmetrically on either side.

Although embodiments have been shown with a main area 100 to act as mass, it should be appreciated that parts of the arms could serve as mass, in which case main area 100 may be omitted, a relevant part of the arms taking its place. Although embodiments have been shown wherein the same electrode is used for both a bias voltage and an AC voltage that serves to excite motion of the structure, it should be understood that separate electrodes may be used for these two functions. In this case electrodes for both functions are preferably disposed symmetrically to the Y axis of mirror symmetry.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A device comprising:
   a substrate;
   a micro electromechanical structure comprising a first arm, a second arm and a connection between the first and second arms,
      the first and second arm each having an end portion attached to the substrate,
      parts of the first and second arms, at least from the end portions to the connection, and the connection being free to move relative to the substrate,
      the first and second arms extending from the end portions to the connection along a first and a second direction respectively, the first and second directions being transverse to each other, the first arm having a width greater than a width of the second arm; and
   an electrode on the substrate, adjacent to the micro electromechanical structure.

2. A device according to claim 1, wherein:
   the first and second arms are each configured and arranged to provide a spring force exhibited by the micro electromechanical structure in response to movement of the micro electromechanical structure relative to the substrate, the first arm being configured and arranged to provide a majority of the spring force; and
   the first and second arms are dimensioned so that, for at least one electric field strength applied via the electrode, at least two non-zero order coefficients of an expansion function are substantially zero, the expansion function indicating an expansion of a stiffness of the electromechanical structure in powers of a deviation of the electromechanical structure from a stable position.

3. A device according to claim 2, further comprising a circuit configured to apply a bias voltage to the electrode to produce said at least one electric field strength.

4. A device according to claim 1, wherein the first arm, the second arm and the connection are made of a single crystalline body.

5. A device according to claim 1, wherein the electrode is configured to apply an electric field to the micro electromechanical structure, the electric field being directed, on average, in the first direction.

6. A device according to claim 1, further comprising a third arm connected to the connection, the third arm having an end portion attached to the substrate, a portion of the third arm being free from the substrate, the second and third arm being disposed mirror symmetrically on both sides of an axis of mirror symmetry that is parallel to the first direction, the electrode being disposed mirror symmetrically with respect to the axis of mirror symmetry.

7. A device according to claim 6, wherein the second and third arms extend from the connection substantially perpendicularly to the first direction.

8. A device according to claim 1, further comprising: a main area connected to the first arm, with a main area mass that exceeds a mass of the first and second arms, the main area being free from the substrate; and a plurality of additional arms, each being parallel to the second arm and having free portions, the second arm being disposed mirror symmetrically on both sides of an axis of mirror symmetry that is parallel to the first direction, and the plurality of additional arms being disposed mirror symmetrically with respect to said axis of mirror symmetry.

9. A device according to claim 8, wherein the main area comprises the connection.

10. A device according to claim 8, wherein the connection and the main area are located on mutually opposite sides of the first arm.

11. A device according to claim 1, wherein:
   the micro electromechanical structure further comprises:
      a main area including the connection;
      a third arm, the second and third arms having free portions coupled between the first arm and end portions attached to the substrate; and
      fourth, fifth, and sixth arms parallel to the first, second, and third arms respectively;
   the fifth and sixth arms have free portions coupled between the fourth arm and end portions attached to the substrate;

the main area, the first arm, and the fourth arm are free from the substrate;

the main area is coupled between the first arm and the fourth arm;

the second and third arms are disposed mirror symmetrically on both sides of an axis of mirror symmetry that is parallel to the first direction in which the first arm extends from the main area to the connection with the second and third arms; and the fifth and sixth arms are disposed mirror symmetrically with respect to said axis of mirror symmetry.

12. A device according to claim 1, further comprising a first and second main area, both free from the substrate, each having a main area mass that exceeds a mass of the first and second arms, the first arm coupling the first and second main areas.

13. A device according to claim 1, wherein the micro electromechanical structure further comprises:

a first main area including the connection;

a second main area;

a third arm, the second and third arms having free portions coupled between the first main area and end portions attached to the substrate, the first arm being coupled to the second and third arms via the first main area, the second and third arms being disposed mirror symmetrically on both sides of an axis of mirror symmetry that is parallel to the first direction; and fourth and fifth arms parallel to the second and third arms, the fourth and fifth arms having free portions coupled between the second main area and end portions attached to the substrate, the fourth and fifth arms being disposed mirror symmetrically with respect to said axis of mirror symmetry.

14. A method of manufacturing a device with a micro electromechanical structure with a first arm, a second arm and a connection between the first and second arms, the first and second arms each having an end portion attached one of directly and indirectly to a substrate, parts of the first and second arms at least from the end portions to the connection and the connection being free to move relative to the substrate, the first and second arms extending from the end portions to the connection along a first and a second direction respectively, the first and second directions being transverse to each other, and an electrode on the substrate and adjacent to the micro electromechanical structure, the method comprising:

selecting a dimension of the first arm and a voltage applied to the electrode to make at least one non-zero order coefficient of an expansion function substantially zero, the expansion function indicating an expansion of the stiffness of the electromechanical structure in powers of a deviation of the electromechanical structure from a stable position; and selecting a dimension of the second arm to make a further non-zero order coefficient of the expansion of the stiffness substantially zero and to cause the first arm to provide a majority of a spring force exhibited by the micro electromechanical structure.

15. A method of operating a device with a micro electromechanical structure having a first arm, a second arm and a connection between the first and second arms, the first and second arms each having an end portion attached one of directly and indirectly to a substrate, parts of the first and second arms at least from the end portions to the connection and the connection being free to move relative to the substrate, the first and second arms extending from the end portions to the connection along a first and a second direction respectively, the first and second directions being transverse to each other, the device further comprising an electrode on the substrate and adjacent to the micro electromechanical structure, the method comprising:

applying a bias voltage to the electrode at which coefficients for at least two non-zero orders of an expansion function are substantially zero, the expansion function indicating an expansion of the stiffness of the electromechanical structure in powers of a deviation of the electromechanical structure from a stable position; and using the first and second arms, providing a spring force to the micro electromechanical structure in response to movement of the micro electromechanical structure relative to the substrate, the first arm providing a majority of the spring force to the micro electromechanical structure.

16. A device according to claim 1, wherein the electrode is configured and arranged to apply an electric field to the micro electromechanical structure, the electric field including a DC bias voltage component and an AC voltage component.

17. A device according to claim 1, wherein:

the electrode is configured and arranged to apply a first electric field to the micro electromechanical structure, the first electric field corresponding to a bias voltage; and the device further includes a second electrode configured to apply a second electric field to the micro electromechanical structure, the second electric field corresponding to an AC voltage.

18. A device according to claim 6, further comprising:

a fourth arm connected to the connection, the fourth arm having an end portion attached to the substrate, a portion of the fourth arm being free from the substrate, and the fourth arm extending from the end portions to the connection along the first and a second direction from the connection in the first direction.

19. A device according to claim 1, wherein the micro electromechanical structure further includes:

a third arm having a first end attached to the substrate and a second end attached to a first mass structure;

a second mass structure, the first arm coupled to the second mass structure and extending between the first and second mass structures; and fourth and fifth arms, each having a first end attached to the substrate and a second end attached to the second mass structure, the second, third, fourth, and fifth arms configured and arranged to allow the micro electromechanical structure to move relative to the substrate.

20. The device according to claim 19, wherein the first arm is attached to the substrate at a point of the first arm between the first and the second end.

21. The device according to claim 19, wherein the first arm is free from attachment to the substrate.

* * * * *